(12) United States Patent
Tsukimura

(10) Patent No.: US 9,160,941 B2
(45) Date of Patent: Oct. 13, 2015

(54) SOLID-STATE IMAGING ELEMENT HAVING SUBSTRATES FORMED ON SEMICONDUCTOR WAFERS AND SOLID-STATE IMAGING APPARATUS HAVING THE SAME SOLID-STATE IMAGING ELEMENT

(71) Applicant: OLYMPUS CORPORATION, Tokyo (JP)

(72) Inventor: Mitsuhiro Tsukimura, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 13/871,247

(22) Filed: Apr. 26, 2013

(65) Prior Publication Data

US 2013/0314573 A1 Nov. 28, 2013

(30) Foreign Application Priority Data

May 28, 2012 (JP) ................................ 2012-120629

(51) Int. Cl.
| | |
|---|---|
| H04N 5/335 | (2011.01) |
| H04N 5/369 | (2011.01) |
| H01L 27/146 | (2006.01) |
| H04N 5/3745 | (2011.01) |
| H04N 5/357 | (2011.01) |

(52) U.S. Cl.
CPC ............ *H04N 5/335* (2013.01); *H01L 27/1461* (2013.01); *H01L 27/14605* (2013.01); *H01L 27/14634* (2013.01); *H04N 5/3575* (2013.01); *H04N 5/369* (2013.01); *H04N 5/37452* (2013.01)

(58) Field of Classification Search
CPC ................... H01L 27/14634; H01L 27/14605; H01L 27/1461; H04N 5/2258; H04N 5/335; H04N 5/369; H04N 5/37452; H04N 5/3575

USPC ........... 348/207.99, 231.99, 240.2, 294–324, 348/345–357, 362–368; 257/291, 292, 294, 257/440, 443–448; 250/208.1
See application file for complete search history.

(56) References Cited

U.S. PATENT DOCUMENTS

| | | | |
|---|---|---|---|
| 6,107,618 A * | 8/2000 | Fossum et al. ............. | 250/208.1 |
| 7,787,026 B1 * | 8/2010 | Flory et al. ............... | 348/231.99 |
| 2009/0294813 A1 * | 12/2009 | Gambino et al. ............ | 257/292 |
| 2009/0322918 A1 * | 12/2009 | Shintani ........................ | 348/294 |

(Continued)

FOREIGN PATENT DOCUMENTS

| | | | |
|---|---|---|---|
| JP | 2009130239 A | * | 6/2009 |
| JP | 2010-256924 A | | 11/2010 |

*Primary Examiner* — Dennis Hogue
(74) *Attorney, Agent, or Firm* — Westerman, Hattori, Daniels & Adrian, LLP

(57) ABSTRACT

In a solid-state imaging apparatus in which a first substrate formed on a first semiconductor wafer and a second substrate formed on a second semiconductor wafer are bonded via a connection portion configured to electrically connect the first and second substrates, the first substrate includes a first pixel region in which a plurality of first photoelectric conversion elements partially transmit incident light and are arranged in a two-dimensional shape. The second substrate includes a second pixel region in which a plurality of second photoelectric conversion elements are arranged in a two-dimensional shape in at least a partial region of a region corresponding to the first pixel region. The first photoelectric conversion elements generate imaging signals, and the second photoelectric conversion elements generate signals to be used in imaging preparation.

9 Claims, 14 Drawing Sheets

(56) References Cited

U.S. PATENT DOCUMENTS

| | | | |
|---|---|---|---|
| 2010/0026865 A1* | 2/2010 | Tivarus et al. | 348/308 |
| 2010/0208115 A1* | 8/2010 | Sugawa et al. | 348/308 |
| 2010/0238334 A1* | 9/2010 | Takahashi | 348/305 |
| 2012/0242867 A1* | 9/2012 | Shuster | 348/240.2 |
| 2013/0075607 A1* | 3/2013 | Bikumandla et al. | 250/332 |
| 2013/0214160 A1* | 8/2013 | Cazaux et al. | 250/338.4 |

* cited by examiner

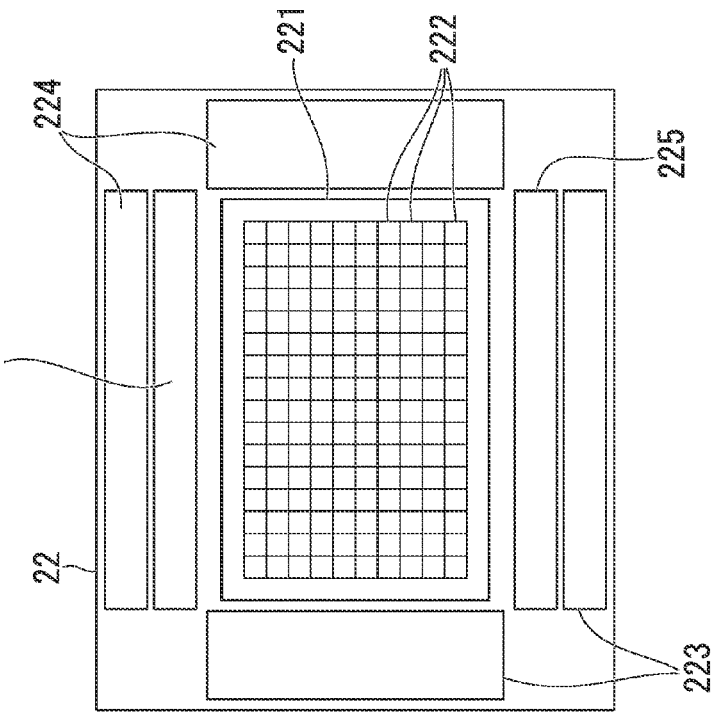
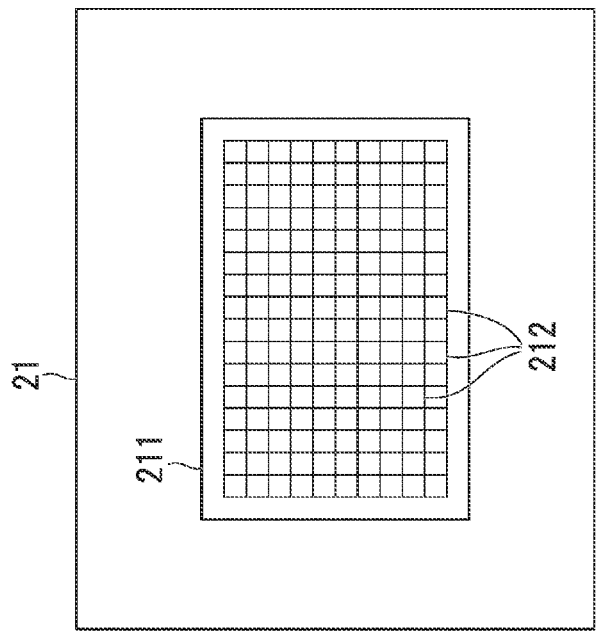
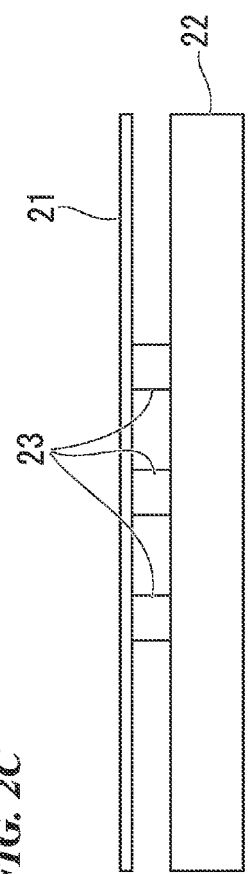

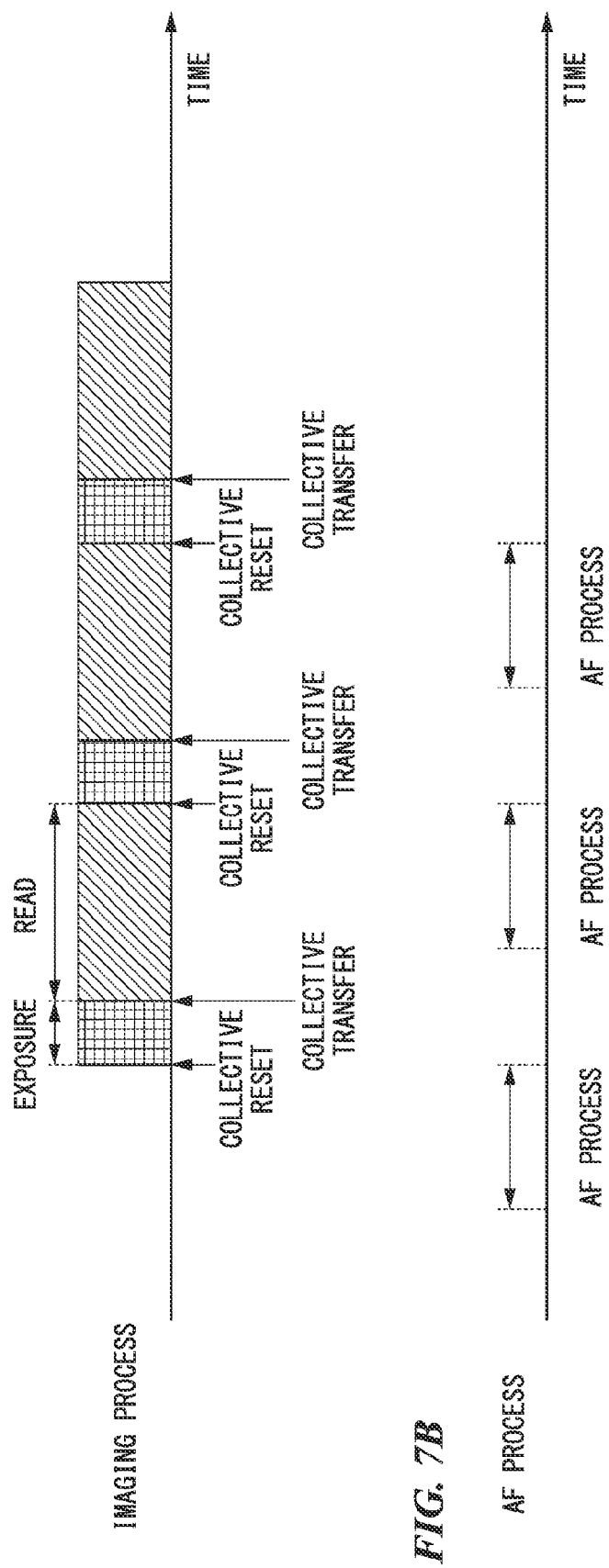

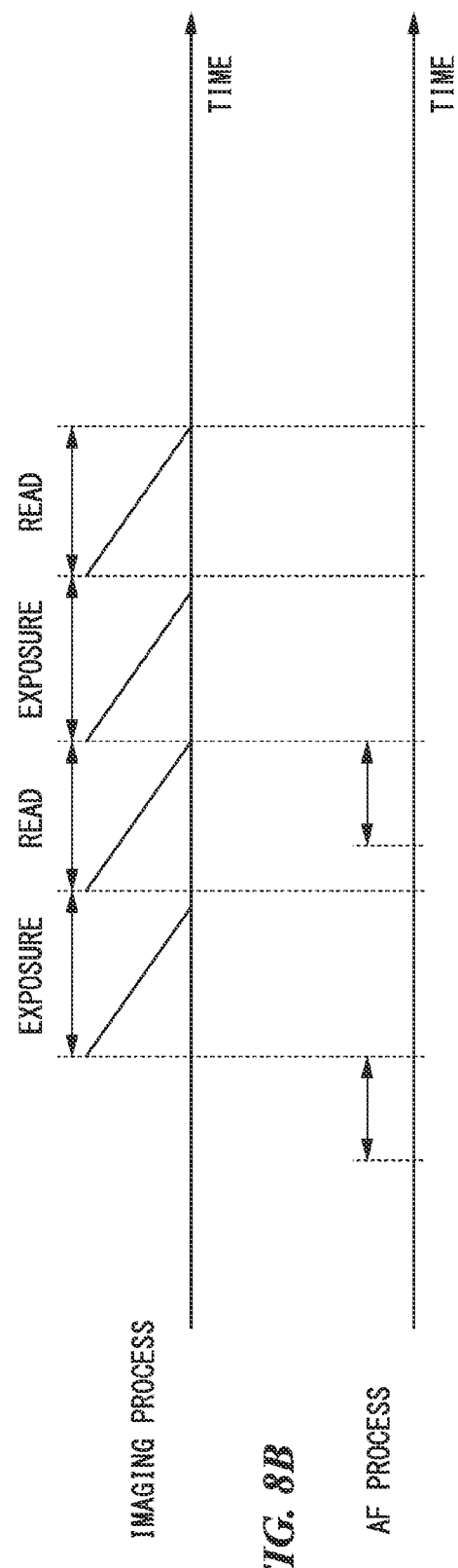

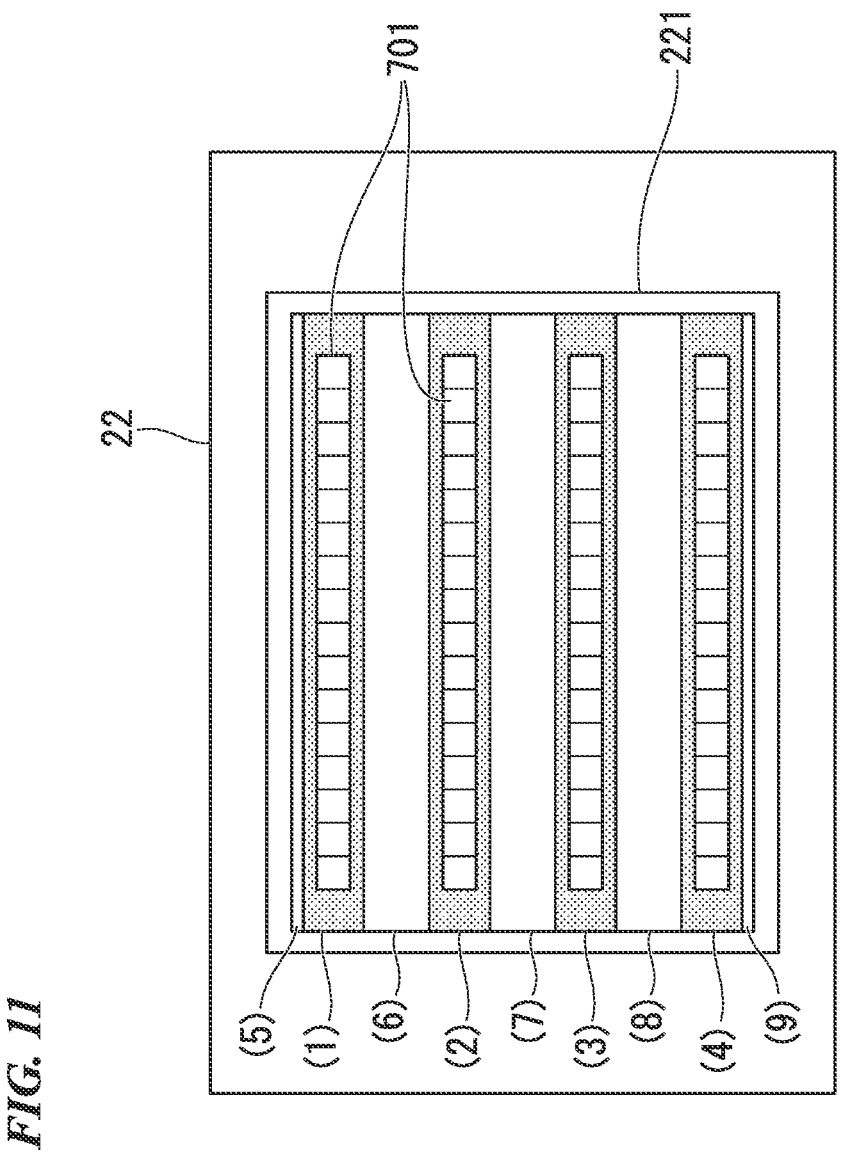

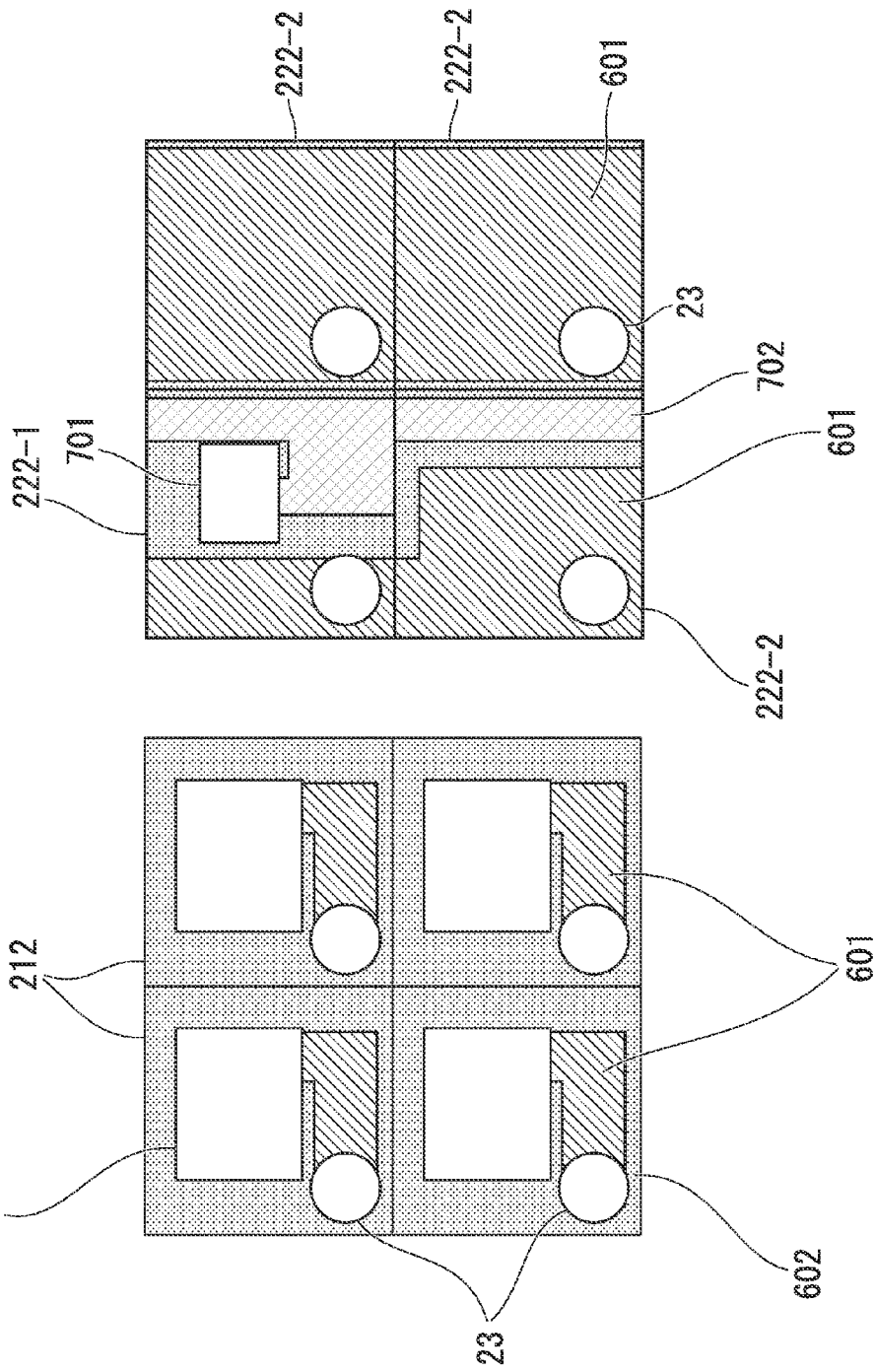

SOLID-STATE IMAGING ELEMENT HAVING SUBSTRATES FORMED ON SEMICONDUCTOR WAFERS AND SOLID-STATE IMAGING APPARATUS HAVING THE SAME SOLID-STATE IMAGING ELEMENT

BACKGROUND OF THE INVENTION

1. Field of the Invention

The present invention relates to a solid-state imaging element and a solid-state imaging apparatus.

This application is based upon and claims the benefit of priority from prior Japanese Patent Application No. 2012-120629, filed May 28, 2012, the entire contents of which are incorporated herein.

2. Description of Related Art

As one of auto focus (AF) methods to be performed using an imaging signal acquired by an imaging element, a contrast method (hill climbing method) is known (for example, see Japanese Unexamined Patent Application, First Publication No. 2010-256924). In the contrast method, the imaging signal is acquired while a lens is moved (extended or retracted), a position at which its high-frequency component (contrast value) peaks is determined to be a focusing position, and the lens is moved to the position.

A processing procedure of a specific AF process will be described with reference to FIG. 14. FIG. 14 is a graph illustrating a relationship between a position of a lens and a contrast value known in the related art. In the illustrated graph, the horizontal axis represents the position of the lens and the vertical axis represents the contrast value. When the AF process is started, an increase/decrease in the contrast value is first determined by driving the lens in an arbitrary direction (Y1; direction determination process). Subsequently, the lens is driven in a direction in which the contrast value is increased based on the direction determination result and the contrast value moves from an increase direction to a decrease direction, so that it is determined that the lens has passed the focusing position (Y2; focusing position passage determination process). Thereafter, the AF drive process ends by restoring the lens to a maximum position (peak position) of the contrast value, that is, a focusing position (Y3; focusing position restoration process).

Next, processing timings of the imaging process and the AF process will be described. FIGS. 15A and 15B are timing charts illustrating the processing timings of the imaging process and the AF process known in the related art. FIG. 15A is a timing chart illustrating the timing of the image process, that is, the drive timing of the imaging element. When the imaging process is performed in the illustrated example, an operation of resetting the imaging element is performed after the AF process has been completed. Subsequently, an exposure/accumulation operation is performed. Subsequently, a signal is read from the imaging element. Thereafter, the process waits until the AF process is completed.

FIG. 15B is a timing chart illustrating the timing of the AF process, that is, the timings of contrast evaluation and lens drive processes. In the illustrated example, the contrast evaluation is first performed, the focusing position is subsequently calculated based on a signal obtained in the contrast evaluation, and a subject is focused by performing the lens drive process based on the calculation result. Thereafter, the AF process is performed after the imaging process has been completed.

Because the process is performed using a signal output by the imaging element in the AF process using a contrast method, it is difficult to acquire a signal necessary for the contrast evaluation while the imaging element performs the imaging process. Thus, as illustrated in FIGS. 15A and 15B, the AF process (the contrast evaluation and lens drive processes) is performed until the reset process of the imaging element is started after a process of reading the imaging signal from the imaging element in the imaging process is completed.

In addition, because an auto exposure (AE) process is also performed using a signal output by the imaging element, it is difficult to acquire a signal necessary for the AE process while the imaging element performs the imaging process as in the AF process. Thus, the AE process (contrast evaluation and lens drive processes) is performed until the reset process of the imaging element is started after a process of reading the imaging signal from the imaging element in the imaging process is completed.

In general, a sum time of several tens of milliseconds (ms) is necessary for the contrast evaluation and lens drive processes in the AF process. FIG. 16 is a timing chart illustrating processing timings when an imaging apparatus known in the related art captures an image. In the illustrated example, processing timings when a time necessary for the AF process is 100 ms and a time necessary to read a signal from the imaging element is 100 ms are illustrated. In this case, when the AF process is performed every time before shooting, a continuous shooting rate is about 5 shots/sec.

In addition, in order to improve the continuous shooting rate, a method of performing the AF process only once immediately before continuous shooting is started is known. FIG. 17 is a timing chart illustrating processing timings in the case in which the imaging apparatus known in the related art performs the AF process once immediately before continuous shooting is started when capturing an image. In the illustrated example, processing timings when a time necessary for the AF process is 100 ms and a time necessary to read a signal from the imaging element is 100 ms are illustrated. In this case, because the AF process is performed only once immediately before the continuous shooting is started, the continuous shooting rate is improved as compared to that of the case illustrated in FIG. 16.

SUMMARY OF THE INVENTION

According to a first aspect of the present invention, a solid-state imaging element is a solid-state imaging apparatus in which a first substrate formed on a first semiconductor wafer and a second substrate formed on a second semiconductor wafer are bonded via a connection portion configured to electrically connect the first and the second substrates. The first substrate includes a first pixel region which partially transmit incident light and in which a plurality of first photoelectric conversion elements are arranged in a two-dimensional shape. The second substrate includes a second pixel region in which a plurality of second photoelectric conversion elements are arranged in a two-dimensional shape in at least a partial region of a region corresponding to the first pixel region. The first photoelectric conversion elements generate imaging signals, and the second photoelectric conversion elements generate signals to be used in imaging preparation.

In addition, according to a second aspect of the present invention, in the solid-state imaging element related to the first aspect, the second substrate further includes a plurality of memories configured to hold the imaging signals generated by the first photoelectric conversion elements.

In addition, according to a third aspect of the present invention, the solid-state imaging element related to the first aspect includes a first scanning circuit configured to drive the first photoelectric conversion elements; and a second scanning circuit configured to drive the second photoelectric conversion elements.

In addition, according to a fourth aspect of the present invention, the solid-state imaging element related to the second aspect includes a first scanning circuit configured to drive the first photoelectric conversion elements so as to collectively transfer the generated imaging signals to the memories and read the imaging signals from the memories in order from the memory arranged in a position near the second photoelectric conversion elements to the memory arranged in a position away from the second photoelectric conversion elements; and a second scanning circuit configured to read the signals to be used in the imaging preparation by driving the second photoelectric conversion elements in a read period in which the first scanning circuit reads the imaging signals.

In addition, according to a fifth aspect of the present invention, in the solid-state imaging element related to the third aspect, the second scanning circuit reads the signals to be used in the imaging preparation by driving the second photoelectric conversion elements in a read period in which the first scanning circuit sequentially reads the imaging signals for every row in which the first photoelectric conversion elements are arranged by driving the first photoelectric conversion elements.

In addition, according to a sixth aspect of the present invention, in the solid-state imaging element related to the first aspect, the first photoelectric conversion element includes a color filter, and the second photoelectric conversion element is arranged in at least a partial region of a region corresponding to a region in which the first photoelectric conversion element having the color filter configured to transmit light of a longest wavelength among the first photoelectric conversion elements is arranged.

In addition, according to a seventh aspect of the present invention, a solid-state imaging apparatus includes the solid-state imaging element related to any one of the first to sixth aspects, wherein the signals to be used in the imaging preparation are used in an AF process.

In addition, according to an eighth aspect of the present invention, a solid-state imaging apparatus includes the solid-state imaging element related to any one of the first to sixth aspects, wherein the signals to be used in the imaging preparation are used in an AE process.

In addition, according to a ninth aspect of the present invention, a solid-state imaging apparatus uses the solid-state imaging element related to any one of the first to sixth aspects in an imaging unit.

BRIEF DESCRIPTION OF THE DRAWINGS

FIG. 2A is a schematic diagram illustrating a configuration of an imaging unit in the first embodiment of the present invention;

FIG. 2B is a schematic diagram illustrating a configuration of the imaging unit in the first embodiment of the present invention;

FIG. 2C is a schematic diagram illustrating a configuration of the imaging unit in the first embodiment of the present invention;

FIG. 7A is a timing chart illustrating processing timings of an imaging process and an AF process in the first embodiment of the present invention;

FIG. 7B is a timing chart illustrating processing timings of the imaging process and the AF process in the first embodiment of the present invention;

FIG. 8A is a timing chart illustrating processing timings of the imaging process and the AF process when an image is captured by performing an exposure operation in a row-sequential method in the first embodiment of the present invention;

FIG. 8B is a timing chart illustrating processing timings of the imaging process and the AF process when an image is captured by performing the exposure operation in the row-sequential method in the first embodiment of the present invention;

FIG. 11 is a schematic diagram illustrating a sequence in which an imaging signal is read from an analog memory in the second embodiment of the present invention;

FIG. 12A is a schematic diagram illustrating an outline of a first unit pixel region and a second unit pixel region in the second embodiment of the present invention;

FIG. 12B is a schematic diagram illustrating an outline of the first unit pixel region and the second unit pixel region in the second embodiment of the present invention;

DETAILED DESCRIPTION OF THE INVENTION

First Embodiment

Figure 1:
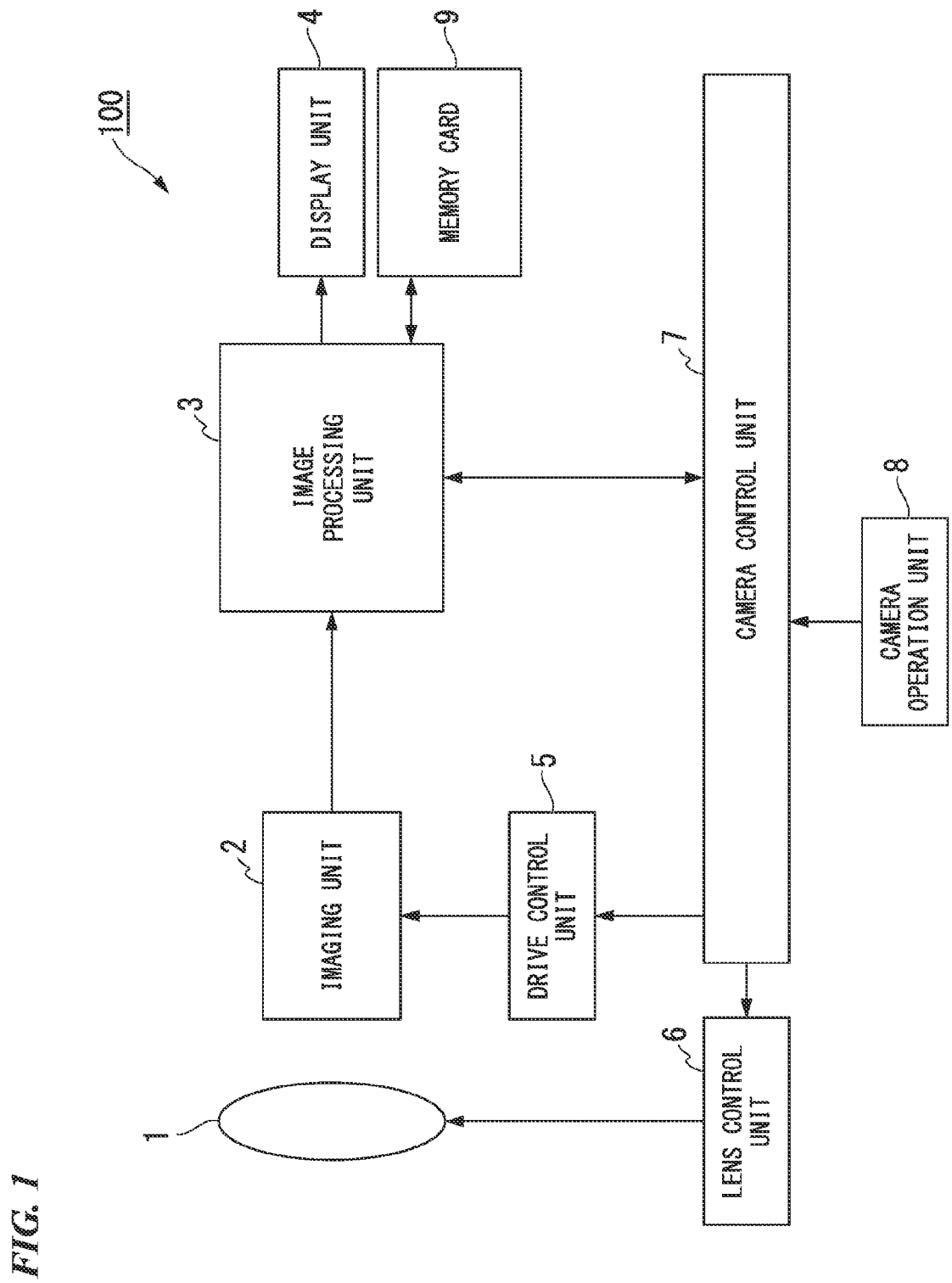
FIG. 1 is a block diagram illustrating a configuration of an imaging apparatus in a first embodiment of the present invention.

Hereinafter, the first embodiment of the present invention will be described with reference to the drawings. FIG. 1 is a block diagram illustrating a configuration of an imaging apparatus in this embodiment. The imaging apparatus related to an aspect of the present invention may be any electronic device having an imaging function, or may be a digital video camera, an endoscope, or the like as well as a digital camera.

The imaging apparatus 100 (solid-state imaging apparatus) illustrated in FIG. 1 includes a lens 1, an imaging unit 2 (solid-state imaging element), an image processing unit 3, a display unit 4, a drive control unit 5, a lens control unit 6, a camera control unit 7, and a camera operation unit 8. Although a memory card 9 is also illustrated in FIG. 1, the memory card 9 is configured to be detachable from the imaging apparatus 100 and hence the memory card 9 may not be a configuration unique to the imaging apparatus 100.

The lens 1 is a imaging lens for forming an optical image of a subject on an imaging surface of the imaging unit 2. The imaging unit 2 includes a plurality of pixels. The imaging unit 2 photoelectrically converts the optical image of the subject formed by the lens 1 into a digital imaging signal, and outputs the digital imaging signal. The image processing unit 3 performs various digital image processing on the imaging signal output from the imaging unit 2.

The display unit 4 displays an image based on the imaging signal on which the image processing has been performed for a display by the image processing unit 3. This display unit 4 can reproduce and display a still image and perform a moving image (live view) display for displaying an image of a range of the subject in real time. The drive control unit 5 controls an operation of the imaging unit 2 based on an instruction from the camera control unit 7. The lens control unit 6 controls an aperture or focusing position of the lens 1 based on the instruction from the camera control unit 7. The drive control unit 5 and the lens control unit 6 perform an imaging process, an Auto Focus (AF) process, or an Auto Exposure (AE) process.

The camera control unit 7 controls the entire imaging apparatus 100. An operation of the camera control unit 7 is prescribed in a program stored in a read only memory (ROM) embedded in the imaging apparatus 100. The camera control unit 7 reads the program and performs various control according to contents prescribed by the program. The camera operation unit 8 has various operation members for allowing a user to input various operations to the imaging apparatus 100, and outputs a signal based on the result of an operation input to the camera control unit 7. An example of the camera operation unit 8 is a power-supply switch for turning on/off a power supply of the imaging apparatus 100, a release button for issuing a still-image shooting instruction, a still-image shooting mode switch for switching a still-image shooting mode between a single shooting mode and a continuous shooting mode, or the like. The memory card 9 is a recording medium for saving an imaging signal processed for recording by the image processing unit 3.

Next, a configuration of the imaging unit 2 will be described. FIGS. 2A, 2B, and 2C are schematic diagrams illustrating the configuration of the imaging unit 2 in this embodiment. FIG. 2A is a front view of a first substrate 21 constituting the imaging unit 2. FIG. 2B is a front view of a second substrate 22 constituting the imaging unit 2. FIG. 2C is a cross-sectional view of the imaging unit 2.

The imaging unit 2 in this embodiment includes two substrates, i.e., the first substrate 21 and the second substrate 22. The first substrate 21 is formed on a semiconductor wafer. In addition, the second substrate 22 is formed on a semiconductor wafer. The first substrate 21 is a back-illuminated imaging substrate, and a thickness of the substrate is as thin as about several micrometers. Thus, light incident on the first substrate 21 is transmitted through the first substrate 21 and is incident on the second substrate 22. For example, an amount of light incident on the second substrate 22 is about ten percent (%) of light incident on the first substrate 21. In this embodiment, an AF pixel configured to output a contrast signal to the second substrate 22 is formed, and the contrast signal output by the AF pixel is used in contrast AF based on light reaching the second substrate 22.

In addition, the imaging unit 2 includes imaging pixels, AF pixels, first scanning circuits 223, second scanning circuits 224, a first signal processing circuit 225, and a second signal processing circuit 226. The imaging pixel includes an imaging photoelectric conversion element (first photoelectric conversion element) and the like, and generates an imaging signal. The AF pixel includes an AF photoelectric conversion element (second photoelectric conversion element) and the like, and generates a contrast signal (a signal to be used in imaging preparation). The first scanning circuit 223 controls the drive of the imaging pixels. The second scanning circuit 224 controls the drive of the AF pixels. The first signal processing circuit 225 processes imaging signals output by the imaging pixels. The second signal processing circuit 226 processes the contrast signal output by the AF pixel.

As illustrated in FIG. 2C, the first substrate 21 and the second substrate 22 are stacked. In addition, light is radiated to a main surface, which is opposite the second substrate 22, between two main surfaces of the first substrate 21 (surfaces each having a relatively larger surface area than a side surface). In addition, connection portions 23 are configured between the first substrate 21 and the second substrate 22, and the first substrate 21 and the second substrate 22 are electrically connected by the connection portions 23. That is, the first substrate 21 and the second substrate 22 are bonded via the connection portions 23. The connection portion 23, for example, is a junction portion between substrates using a micro bump or a junction portion connected between the substrates according to a direct junction method.

A first pixel region 211 is formed on the first substrate 21. The first pixel region 211 has a plurality of first unit pixel regions 212 arranged in a two-dimensional shape. An imaging photoelectric conversion element and the like provided in the imaging pixel are formed in the first unit pixel region 212. Details of the first unit pixel region 212 will be described later.

In addition, in the second substrate 22, the second pixel region 221 is formed in at least a partial region of a region corresponding to a region in which the first pixel region 211 is formed. In the illustrated example, in a region of the second substrate 22, the second pixel region 221 is formed in a region corresponding to the region of the first substrate 21 in which the first pixel region 211 is formed. That is, when viewed from a main surface direction of the first substrate 21, a region of a second unit pixel region 222 is included in at least a partial region of the region of the first pixel region 211. Through this configuration, light transmitted through the first pixel region 211 is incident on the second pixel region 221.

The second pixel region 221 has a plurality of second unit pixel regions 222 arranged in a two-dimensional shape. In the second unit pixel region 222, an AF photoelectric conversion element and the like provided in the AF pixel are formed. Details of the second unit pixel region 222 will be described later. In addition, on the second substrate 22, the first scanning circuits 223, the second scanning circuits 224, the first signal processing circuit 225, and the second signal processing circuit 226 are formed.

Figure 3:
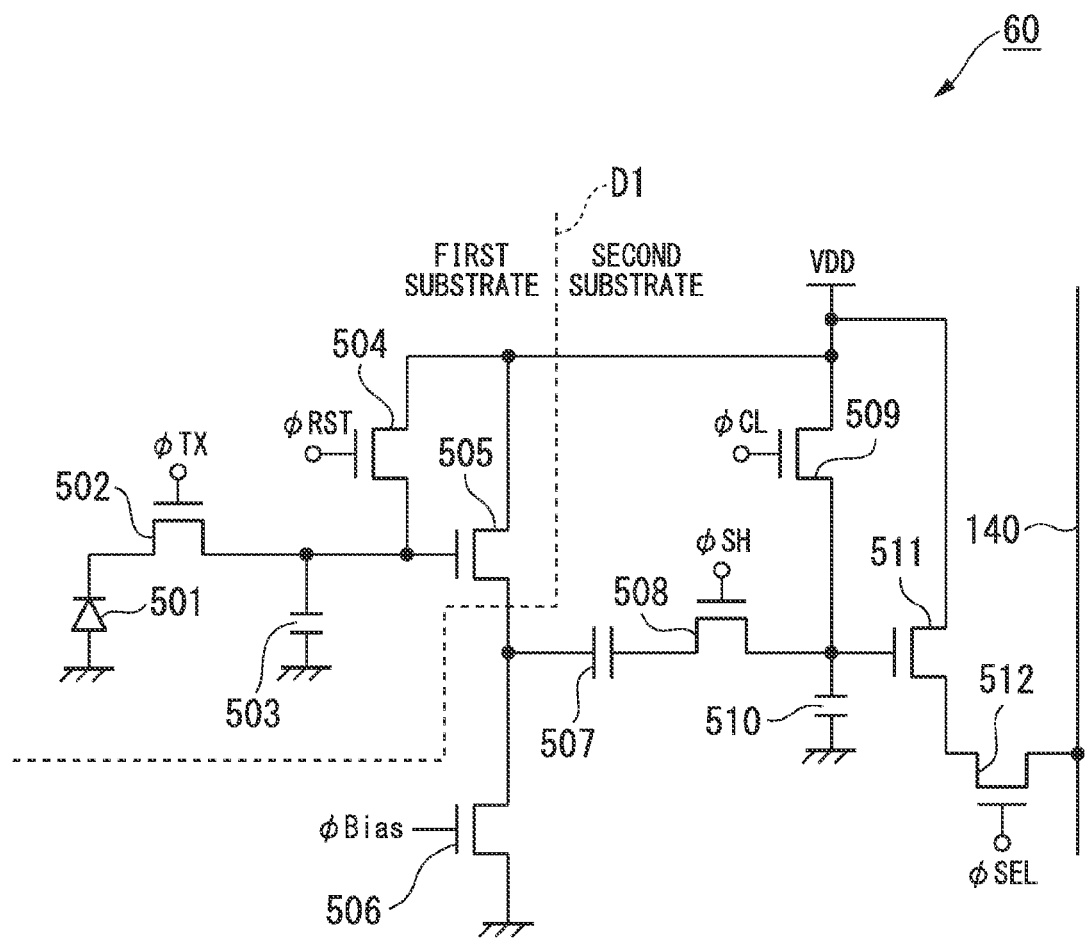
FIG. 3 is a circuit diagram illustrating a circuit configuration of an imaging pixel in the first embodiment of the present invention.

Next, a configuration of the imaging pixel will be described. FIG. 3 is a circuit diagram illustrating a circuit configuration of the imaging pixel 60 in this embodiment. The imaging pixel 60 includes an imaging photoelectric conversion element 501 (first photoelectric conversion element), a transfer transistor 502, a floating diffusion (FD) 503, an FD reset transistor 504, a first amplification transistor 505, a load transistor 506, a clamp capacitor 507, a sampling transistor 508, an analog memory reset transistor 509, an analog memory 510 (memory), a second amplification transistor 511, and a selection transistor 512. A layout position of each circuit element illustrated in FIG. 3 is not necessarily consistent with an actual layout position. In addition, in the illustrated example, one analog memory 510 is provided for one imaging photoelectric conversion element 501. However, the present invention is not limited thereto. One analog memory 501 may be shared by a plurality of imaging photoelectric conversion elements 501.

One end of the imaging photoelectric conversion element 501 is grounded. A drain terminal of the transfer transistor 502 is connected to the other end of the imaging photoelectric conversion element 501. A gate terminal of the transfer transistor 502 is connected to the first scanning circuit 223 and receives a transfer pulse φTX.

One end of the FD 503 is connected to a source terminal of the transfer transistor 502, and the other end of the FD 503 is grounded. The drain terminal of the FD reset transistor 504 is connected to a power supply voltage VDD, and the source terminal of the FD reset transistor 504 is connected to the source terminal of the transfer transistor 502. The gate terminal of the FD reset transistor 504 is connected to the first scanning circuit 223 and receives an FD reset pulse φRST.

The drain terminal of the first amplification transistor 505 is connected to the power supply voltage VDD. The gate terminal, which is an input portion of the first amplification transistor 505, is connected to the source terminal of the transfer transistor 502. The drain terminal of the load transistor 506 is connected to the source terminal of the first amplification transistor 505, and the source terminal of the load transistor 506 is grounded. The gate terminal of the load transistor 506 is connected to the first scanning circuit 223 and receives a current control pulse φBias.

One end of the clamp capacitor 507 is connected to the source terminal of the first amplification transistor 505 and the drain terminal of the load transistor 506. The drain terminal of the sampling transistor 508 is connected to the other end of the clamp capacitor 507. The gate terminal of the sampling transistor 508 is connected to the first scanning circuit 223 and receives a sampling pulse φSH.

The drain terminal of the analog memory reset transistor 509 is connected to the power supply voltage VDD, and the source terminal of the analog memory reset transistor 509 is connected to the source terminal of the sampling transistor 508. The gate terminal of the analog memory reset transistor 509 is connected to the first scanning circuit 223 and receives a clamp and memory reset pulse φCL.

One end of the analog memory 510 is connected to the source terminal of the sampling transistor 508, and the other end of the analog memory 510 is grounded. The drain terminal of the second amplification transistor 511 is connected to the power supply voltage VDD. The gate terminal constituting an input portion of the second amplification transistor 511 is connected to the source terminal of the sampling transistor 508. The drain terminal of the selection transistor 512 is connected to the source terminal of the second amplification transistor 511, and the source terminal of the selection transistor 512 is connected to a vertical signal line 140. The vertical signal line 140 is connected to the first signal processing circuit 225. The gate terminal of the selection transistor 512 is connected to the first scanning circuit 223, and receives a selection pulse φSEL. Polarity may be reversed in terms of the above-described transistors, and the source terminal and the drain terminal may be opposite to the above.

The imaging photoelectric conversion element 501, for example, is a photodiode, and generates signal charges based on incident light and holds and accumulates the generated signal charges. The transfer transistor 502 transfers the signal charges accumulated in the imaging photoelectric conversion element 501 to the FD 503. ON/OFF of the transfer transistor 502 is controlled by the transfer pulse φTX from the first scanning circuit 223. The FD 503 temporarily holds and accumulates the signal charges transferred from the imaging photoelectric conversion element 501.

The FD reset transistor 504 resets the FD 503. ON/OFF of the FD reset transistor 504 is controlled by the FD reset pulse φRST from the first scanning circuit 223. It is also possible to reset the imaging photoelectric conversion element 501 by simultaneously turning on the FD reset transistor 504 and the transfer transistor 502. The reset of the FD 503/the imaging photoelectric conversion element 501 sets a state (potential) of the FD 503/the imaging photoelectric conversion element 501 to a standard state (standard potential or reset level) by controlling an amount of charges accumulated in the FD 503/the imaging photoelectric conversion element 501.

The first amplification transistor 505 outputs an amplification signal obtained by amplifying a signal based on the signal charges, which are accumulated in the FD 503, input to the gate terminal, from the source terminal. The load transistor 506 functions as a load of the first amplification transistor 505, and supplies the first amplification transistor 505 with a current for driving the first amplification transistor 505. ON/OFF of the load transistor 506 is controlled by the current control pulse φBias from the first scanning circuit 223. The first amplification transistor 505 and the load transistor 506 constitute a source follower circuit.

The clamp capacitor 507 clamps (fixes) a voltage level of the amplification signal output from the first amplification transistor 505. The sampling transistor 508 samples and holds the voltage level of the other end of the clamp capacitor 507, and accumulates the sampled and held voltage level in the analog memory 510. ON/OFF of the sampling transistor 508 is controlled by the sampling pulse φSH from the first scanning circuit 223.

The analog memory reset transistor 509 resets the analog memory 510. The reset of the analog memory 510 sets a state (potential) of the analog memory 510 to a standard state (standard potential or reset level) by controlling an amount of charges accumulated in the analog memory 510. The analog memory 510 holds and accumulates an analog signal sampled and held by the sampling transistor 508.

A capacitor of the analog memory 510 is set to be larger than a capacitor of the FD 503. In the analog memory 510, it is more preferable to use a metal insulator metal (MIM) capacitor or a metal oxide semiconductor (MOS) capacitor, which are small capacitors having a leak current (dark current) per unit area. Thereby, resistance to noise is improved and a high-quality signal is obtained.

The second amplification transistor 511 outputs an amplification signal obtained by amplifying a signal based on the signal charges, which are accumulated in the analog memory 510, input to the gate terminal, from the source terminal. The second amplification transistor 511 and a current source (not illustrated) serving as a load connected to the vertical signal line 140 constitute a source follower circuit. The selection transistor 512 selects the imaging pixel 60 and transfers an output of the second amplification transistor 511 to the vertical signal line 140. ON/OFF of the selection transistor 512 is controlled by the selection pulse φSEL from the first scanning circuit 223.

Among circuit elements illustrated in FIG. 3, the imaging photoelectric conversion element 501 is arranged on the first substrate 21, the analog memory 510 is arranged on the second substrate 22, and the other circuit elements are arranged on one of the first substrate 21 and the second substrate 22. A dashed line D1 of FIG. 3 indicates a boundary line between the first substrate 21 and the second substrate 22. In the illustrated example, the imaging photoelectric conversion element 501, the transfer transistor 502, the FD 503, the FD reset transistor 504, and the first amplification transistor 505 are arranged on the first substrate 21. The load transistor 506, the clamp capacitor 507, the sampling transistor 508, the analog memory reset transistor 509, the analog memory 510, the second amplification transistor 511, and the selection transistor 512 are arranged on the second substrate 22.

The amplification signal output from the first amplification transistor 505 of the first substrate 21 is output to the second substrate 22 via the connection portion 23. In addition, the power supply voltage VDD is exchanged between the first substrate 21 and the second substrate 22 via the connection portion 23.

In FIG. 3, the connection portion 23 is arranged along a path among the source terminal of the first amplification transistor 505, the drain terminal of the load transistor 506, and one end of the clamp capacitor 507. However, the present invention is not limited thereto. The connection portion 23 may be arranged at any position along a path electrically connected from the imaging photoelectric conversion element 501 to the analog memory 510.

Figure 4:
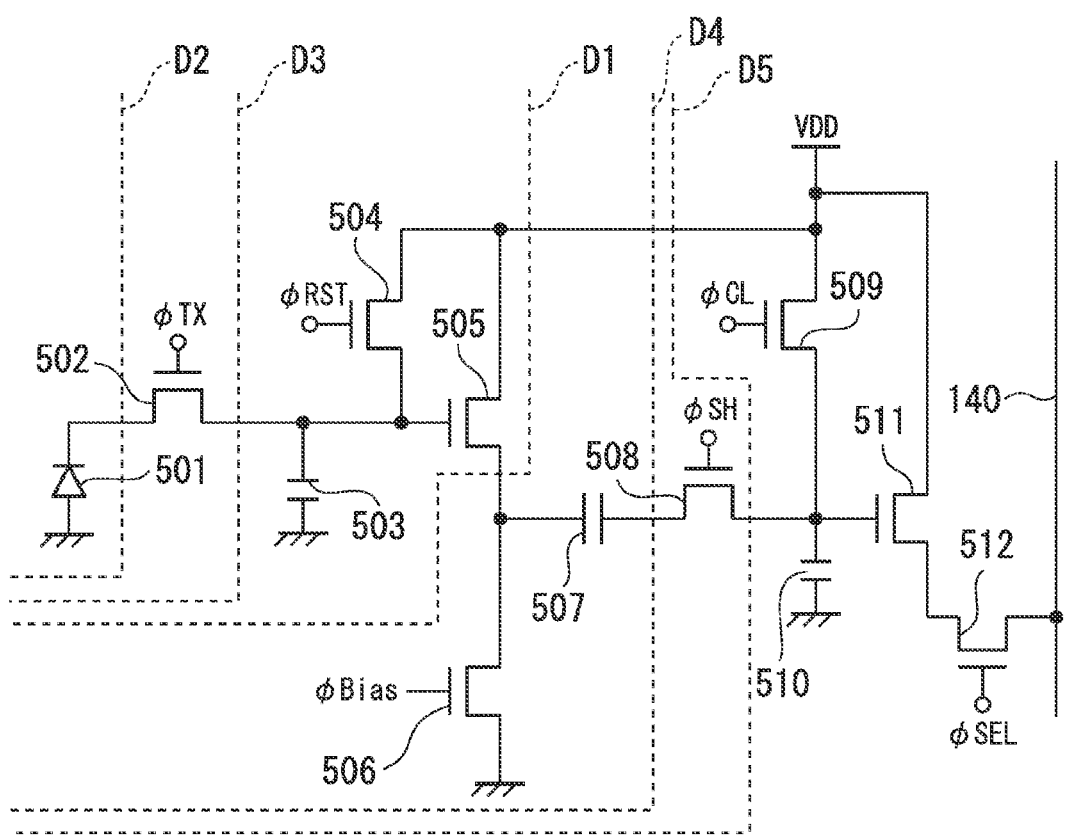
FIG. 4 is a schematic diagram illustrating an example of a boundary line between a first substrate and a second substrate in the first embodiment of the present invention.

FIG. 4 is a schematic diagram illustrating an example of a boundary line between the first substrate 21 and the second substrate 22 in this embodiment. Dashed lines D1 to D5 indicate examples available as the boundary line between the first substrate 21 and the second substrate 22. The boundary line between the first substrate 21 and the second substrate 22 may be one of the dashed lines D1 to D5, or may be different therefrom. The dashed line D1 is the same as described above. In the example in which the dashed line D2 is illustrated, the connection portion 23 is arranged along a path between the other end of the imaging photoelectric conversion element 501 and the drain terminal of the transfer transistor 502. In the example in which the dashed line D3 is illustrated, the connection portion 23 is arranged along a path among the source terminal of the transfer transistor 502, one end of the FD 503, the source terminal of the FD reset transistor 504, and the gate terminal of the first amplification transistor 505.

In the example in which the dashed line D4 is illustrated, the connection portion 23 is arranged along a path between the other end of the clamp capacitor 507 and the drain terminal of the sampling transistor 508. In the example in which the dashed line D5 is illustrated, the connection portion 23 is arranged along a path among the source terminal of the sampling transistor 508, the source terminal of the analog memory reset transistor 509, one end of the analog memory 510, and the gate terminal of the second amplification transistor 511.

Figure 5A:
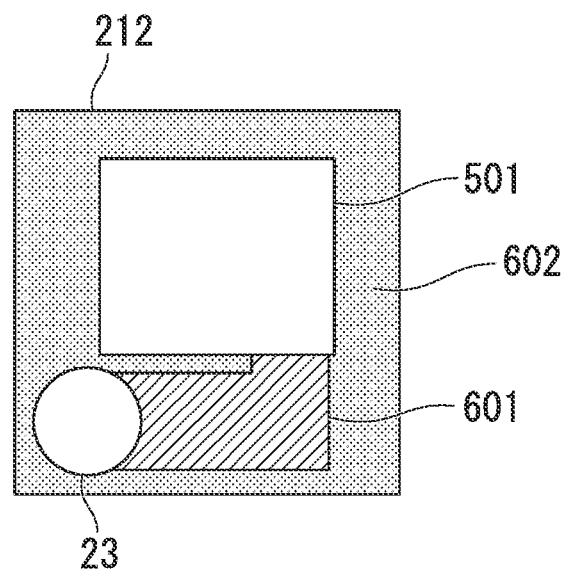
FIG. 5A is a schematic diagram illustrating an outline of a first unit pixel region and a second unit pixel region in the first embodiment of the present invention.
Figure 5B:
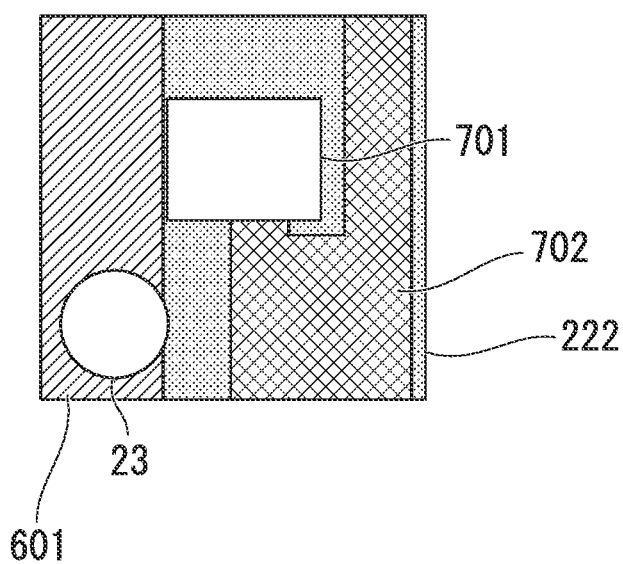
FIG. 5B is a schematic diagram illustrating an outline of the first unit pixel region and the second unit pixel region in the first embodiment of the present invention.

Next, details of the first unit pixel region 212 and the second unit pixel region 222 will be described. FIGS. 5A and 5B are schematic diagrams illustrating an outline of the first unit pixel region 212 and the second unit pixel region 222 in this embodiment. FIG. 5A is a front view of the first unit pixel region 212. FIG. 5B is a front view of the second unit pixel region 222. In the illustrated example, the first unit pixel region 212 includes the connection portion 23, the imaging photoelectric conversion element 501 (first photoelectric conversion element), an imaging pixel circuit wiring region 601, and an imaging pixel circuit power-supply wiring region 602. In addition, the second unit pixel region 222 includes the connection portion 23, the imaging pixel circuit wiring region 601, an AF photoelectric conversion element 701 (second photoelectric conversion element), and an AF pixel circuit wiring region 702.

The connection portion 23 and the imaging photoelectric conversion element 501 are the same as described above. The imaging pixel circuit wiring region 601 is a region in which portions other than the imaging photoelectric conversion element 501 among parts provided in the imaging pixel 60 and a wiring are arranged. In this embodiment, the analog memory 510 (memory) configured to accumulate an imaging signal generated by the imaging photoelectric conversion element 501 among portions provided in the imaging pixel 60 is arranged in the imaging pixel circuit wiring region 601 included in the second unit pixel region 222.

The imaging pixel circuit power-supply wiring region 602 is a region in which a wiring for supplying power to the imaging pixel 60 is arranged. The AF photoelectric conversion element 701 generates a contrast signal corresponding to received light. The AF pixel circuit wiring region 702 is a region in which portions other than the AF photoelectric conversion element 701 among portions provided in the AF pixel and a wiring are arranged. As described above, the first substrate 21 partially transmits incident light. Accordingly, the AF photoelectric conversion element 701 can generate the contrast signal based on the light transmitted through the first substrate 21.

Figure 6:
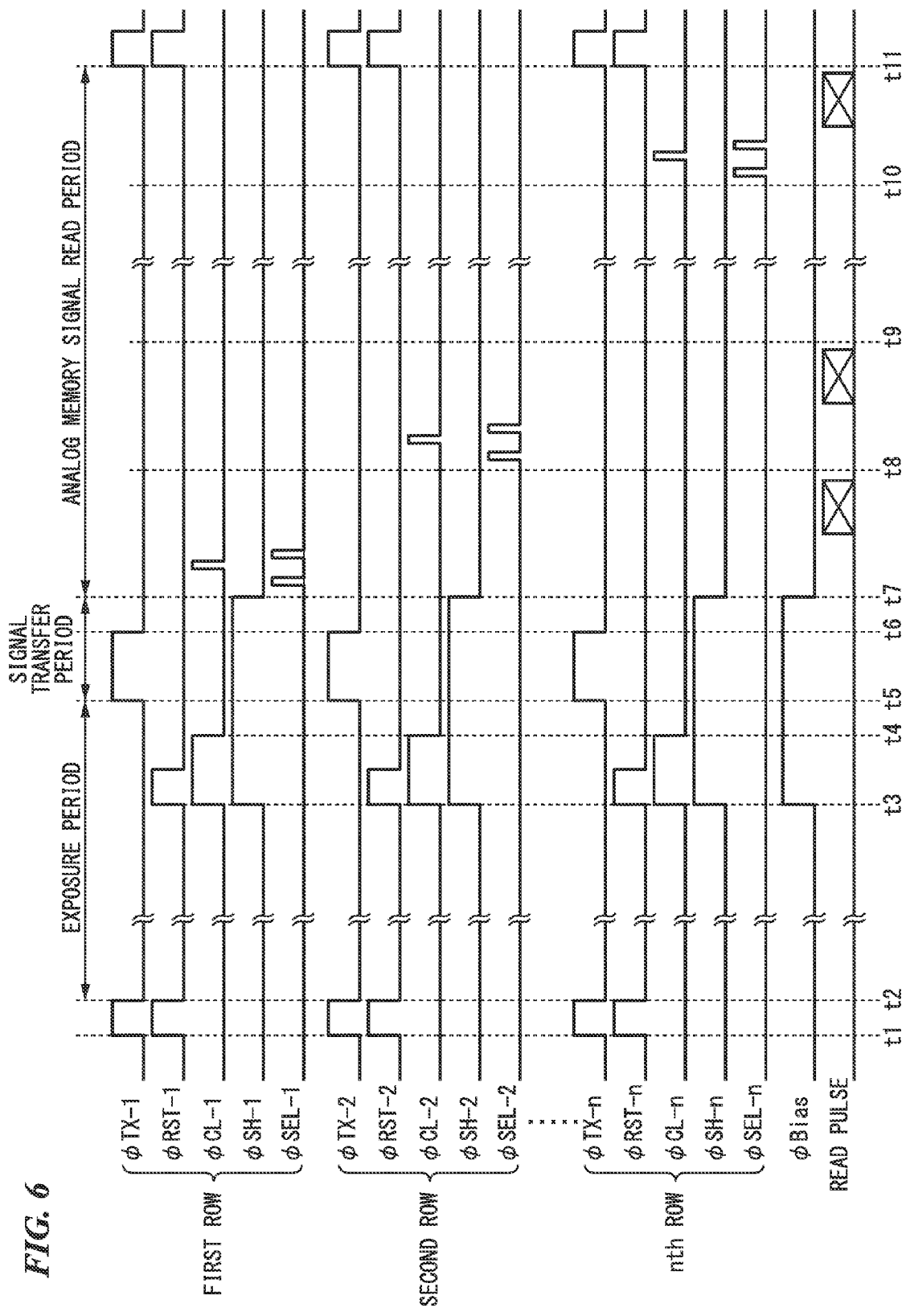
FIG. 6 is a timing chart illustrating output timings of control signals in the first embodiment of the present invention.

Next, an operation of the imaging pixel 60 will be described with reference to FIG. 6. FIG. 6 illustrates control signals from the first scanning circuit 223 to imaging pixels 60 for every row and a current control pulse φBias to be supplied collectively (simultaneously) to imaging pixels 60 of all rows, and a read pulse for reading a signal. Hereinafter, description will be given by adding a suffix indicating a row number to the control signal. For example, the transfer pulse φTX to be output to the imaging pixel 60 of a first row is denoted by φTX-1. In addition, description will be given by adding i indicating a row number when a control signal of an arbitrary row is indicated. For example, a transfer pulse φTX to be output to the imaging pixels 60 of all the rows, that is, all imaging pixels 60 (hereinafter referred to as all pixels), is denoted by φTX-i.

At a time t1, the transfer pulse φTX-i to be output to all the pixels is changed from a "low (L)" level to a "high (H)" level, and hence transfer transistors 502 of all the pixels are turned on. Simultaneously, an FD reset pulse φRST-i to be output to all the pixels is changed from the "L" level to the "H" level, and hence FD reset transistors 504 of all the pixels are turned on. Thereby, the imaging photoelectric conversion element 501 is reset.

Subsequently, at a time t2, the transfer pulse φTX-i and the FD reset pulse φRST-i to be output to all the pixels are changed from the "H" level to the "L" level, and hence the transfer transistors 502 and the FD reset transistors 504 of all the pixels are turned off. Thereby, the reset of the imaging photoelectric conversion elements 501 of all the pixels ends, and exposure of all the pixels (accumulation of signal charges) is collectively (simultaneously) started.

At a time t3 within an exposure period, the FD reset pulse φRST-i to be output to all the pixels is changed from the "L" level to the "H" level, and hence the FD reset transistors 504 of all the pixels are turned on. Thereby, the FDs 503 of all the pixels are reset. Simultaneously, the current control pulse φBias to be output to all the pixels is changed from the "L" level to the "H" level, and hence load transistors 506 of all the pixels are turned on. Thereby, a drive current is supplied to the first amplification transistor 505 and the first amplification transistor 505 starts an amplification operation.

Simultaneously, the clamp and memory reset pulse φCL-i to be output to all the pixels is changed from the "L" level to the "H" level, and hence analog memory reset transistors 509 of all the pixels are turned on. Thereby, the analog memories 510 of all the pixels are reset. Simultaneously, the sampling pulse φSH-i to be output to all the pixels is changed from the "L" level to the "H" level, and hence sampling transistors 508 of all the pixels are turned on. Thereby, the potential of the other end of the clamp capacitor 507 is reset to the power supply voltage VDD, and the sampling transistor 508 starts an operation of sampling and holding the potential of the other end of the clamp capacitor 507.

Subsequently, the FD reset pulse φRST-i to be output to all the pixels is changed from the "H" level to the "L" level, and thus FD reset transistors 504 of all the pixels are turned off. Thereby, the reset of the FDs 503 of all the pixels end. It is only necessary that a timing at which the reset of the FD 503 is performed be in the exposure period. However, it is possible to further reduce noise due to a leak current of the FD 503 by resetting the FD 503 at a timing immediately before the end of the exposure period.

Subsequently, at a time t4 within the exposure period, the clamp and memory reset pulse φCL-i to be output to all the pixels is changed from the "H" level to the "L" level, and hence analog memory reset transistors 509 of all the pixels are turned off. Thereby, the reset of the analog memories 510 of all the pixels ends. At this time, the clamp capacitor 507 clamps the amplification signal to be output from the first amplification transistor 505 (the amplification signal after the reset of the FD 503).

Subsequently, at a time t5, the transfer pulse φTX-i to be output to all the pixels is changed from the "L" level to the "H" level, and hence the transfer transistors 502 of all the pixels are turned on. Thereby, signal charges accumulated in the imaging photoelectric conversion elements 501 of all the pixels are transferred to the FDs 503 via the transfer transistors 502 and accumulated in the FDs 503. As illustrated in FIG. 6, a period from the time t2 to the time t5 is an exposure period.

Subsequently, at a time t6, the transfer pulse φTX-i to be output to all the pixels is changed from the "H" level to the "L" level, and hence the transfer transistors 502 of all the pixels are turned off. Thereby, exposure of all the pixels (accumulation of signal charges) collectively (simultaneously) end.

Subsequently, at a time t7, the sampling pulse φSH-i to be output to all the pixels is changed from the "H" level to the "L" level, and hence the sampling transistors 508 of all the pixels are turned off. Thereby, the sampling transistor 508 ends an operation of sampling and holding the potential of the other end of the clamp capacitor 507. Simultaneously, the current control pulse φBias to be output to all the pixels is changed from the "H" level to the "L" level, and hence load transistors 506 of all the pixels are turned off. Thereby, the supply of the drive current to the first amplification transistor 505 is stopped, and the first amplification transistor 505 stops the amplification operation. As illustrated in FIG. 6, a period from the time t5 to the time t7 is a signal transfer period.

Next, processing timings of the imaging process and the AF process will be described. FIGS. 7A and 7B are timing charts illustrating the processing timings of the imaging process and the AF process in this embodiment. FIG. 7A is the timing chart illustrating the timing of the imaging process, that is, a drive timing of the imaging pixel 60. FIG. 7B is the timing chart illustrating the timing of the AF process, that is, timings of contrast evaluation and lens drive processes.

In the illustrated example, the AF process is performed first. After the AF process has been completed, an operation of collectively resetting the imaging photoelectric conversion elements 501 provided in the imaging pixels 60 is performed. Subsequently, the exposure/accumulation operation is performed and then imaging signals are collectively transferred to the analog memories 510. Subsequently, the imaging signals are read from the analog memories 510. Also, in this embodiment, the AF process is performed when signals are read from the analog memories 510. Thus, when second and subsequent imaging processes are performed, it is possible to immediately start the imaging process without waiting for the AF process to end.

Although an image is captured in a collective exposure method in the examples illustrated in FIGS. 7A and 7B, the image may be captured by performing an exposure operation in a row-sequential method. FIGS. 8A and 8B are timing charts illustrating processing timings of the imaging process and the AF process when an image is captured by performing the exposure operation in the row-sequential method in this embodiment. FIG. 8A is the timing chart illustrating the timing of the imaging process, that is, the drive timing of the imaging pixel 60. FIG. 8B is the timing chart illustrating the timing of the AF process, that is, the timings of the contrast evaluation and lens drive processes.

In the illustrated example, the AF process is first performed. After the AF process has been completed, an operation of resetting the imaging photoelectric conversion elements 501 provided in the imaging pixels 60 is performed. Subsequently, the exposure/accumulation operation is performed. Subsequently, signals are read from the imaging photoelectric conversion elements 501 for every row. In this embodiment, when the signals are read from the imaging photoelectric conversion elements 501 for every row, the AF process is started. Thus, when second and subsequent imaging processes are performed, it is possible to immediately start the imaging process without waiting for the AF process to end.

As described above, according to this embodiment, the imaging unit 2 (solid-state imaging element) includes the first substrate 21 and the second substrate 22 that are stacked. The first substrate 21 partially transmits incident light. In addition, the imaging photoelectric conversion element 501 provided in the imaging pixel 60 is arranged on the first substrate 21. In addition, the AF photoelectric conversion element 701 provided in the AF pixel is arranged on the second substrate 22. Through this configuration, each of the imaging photoelectric conversion element 501 and the AF photoelectric conversion element 701 can independently operate and the AF process can be completed by generating the contrast signal while the imaging signal is read. Accordingly, it is possible to improve a continuous shooting rate while the AF process is performed every time before an image is captured.

In addition, because the first substrate 21 and the second substrate 22 are stacked according to this embodiment, it is possible to reduce a surface area of the imaging unit 2 even when the imaging photoelectric conversion element 501 and the AF photoelectric conversion element 701 are provided.

Although an example of the contrast signal used in the AF process as a signal used in the imaging preparation has been described in the above-described example, the present invention is not limited thereto and any signal may be used. For example, an AE pixel may be formed on the second substrate 22 instead of the AF pixel, and a signal to be used in the AE process may be output as a signal to be used in imaging preparation. Through this configuration, it is possible to perform the AE process by acquiring a signal to be used in the AE process while an imaging signal is read as in the above-described AF process. Accordingly, it is possible to improve a continuous shooting rate while the AE process is performed every time before an image is captured.

Second Embodiment

Next, the second embodiment will be described. A configuration of an imaging apparatus 100 in the second embodiment is substantially the same as the configuration of the imaging apparatus 100 in the first embodiment. This embodiment is different from the first embodiment in that an AF photoelectric conversion element 701 is provided in only some second unit pixel regions 222 among the second unit pixel regions 222. A light shielding portion is provided in the second unit pixel region 222 in which no AF photoelectric conversion element 701 is provided. That is, in this embodiment, the AF photoelectric conversion element 701 is provided only in a position in which a signal to be used in the AF process is acquired.

Figure 9A:
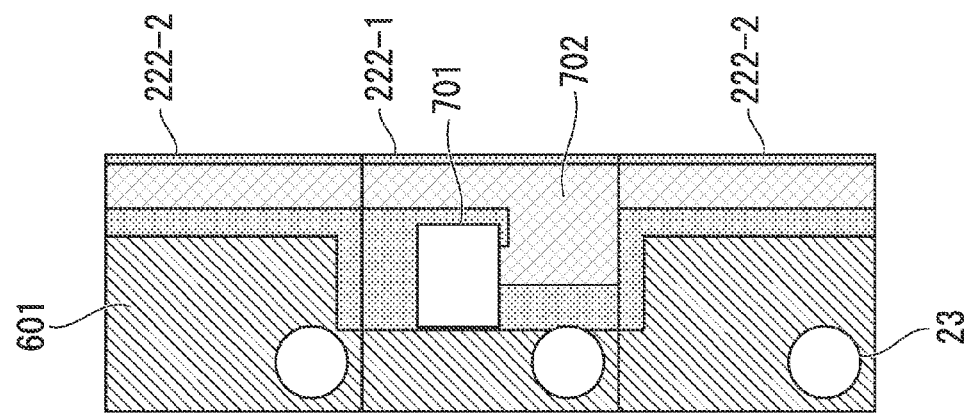
FIG. 9A is a schematic diagram illustrating an outline of a first unit pixel region and a second unit pixel region in a second embodiment of the present invention.
Figure 9B:
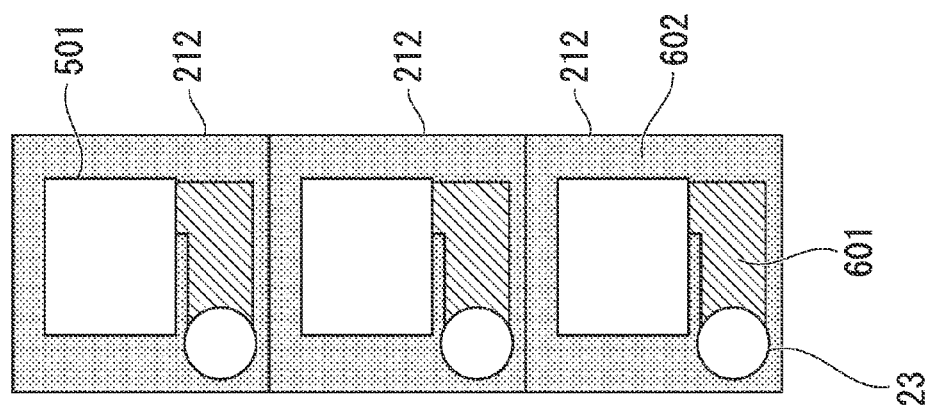
FIG. 9B is a schematic diagram illustrating an outline of the first unit pixel region and the second unit pixel region in the second embodiment of the present invention.

Next, details of a first unit pixel region 212 and second unit pixel regions 222-1 and 222-2 will be described. FIGS. 9A and 9B are schematic diagrams illustrating outlines of the first unit pixel region 212 and the second unit pixel regions 222-1 and 222-2 in this embodiment. FIG. 9A is a front view of the first unit pixel region 212. FIG. 9B is a front view of the second unit pixel regions 222-1 and 222-2. In the illustrated example, a configuration of the first unit pixel region 212 is substantially the same as the configuration of the first unit pixel region 212 in the first embodiment. A configuration of the second unit pixel region 222-1 is substantially the same as the configuration of the second unit pixel region 222 in the first embodiment. In addition, the second unit pixel region 222-2 includes a connection portion 23, an imaging pixel circuit wiring region 601, and an AF pixel circuit wiring region 702. In this embodiment, it is assumed that a set of one second unit pixel region 222-1 and two second unit pixel regions 222-2 aligned and arranged vertically is designated as one set of unit pixel regions. That is, one contrast signal is output by the second unit pixel regions 222-1 and 222-2 for three rows and one column.

In addition, in this embodiment, a light shielding portion 901 is arranged in the second unit pixel region 222-2 so that no light is incident on the second unit pixel region 222-2 in which no AF photoelectric conversion element 701 is arranged.

Figure 10B:
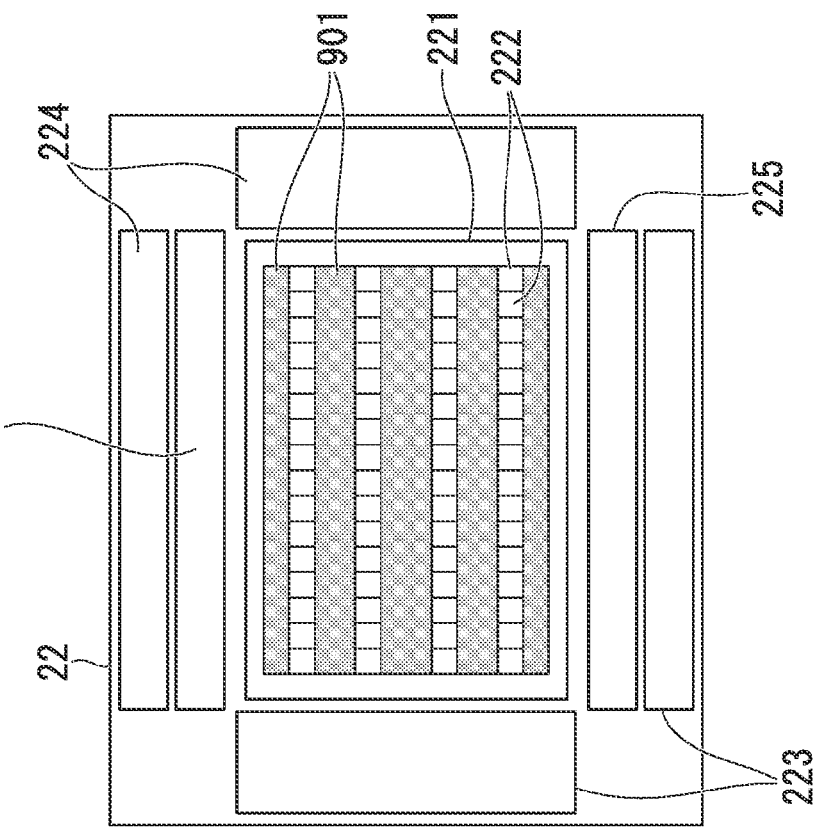
FIG. 10B is a schematic diagram illustrating a configuration of the imaging unit in the second embodiment of the present invention.
Figure 10A:
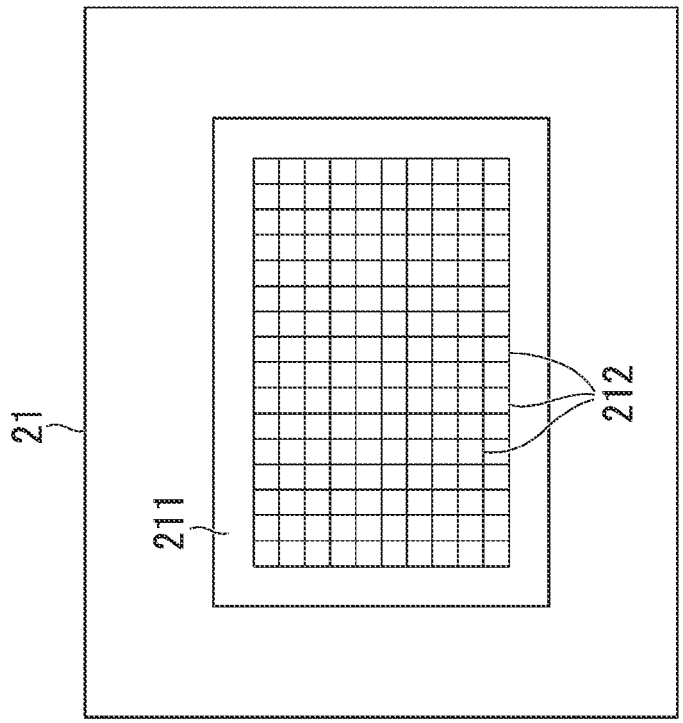
FIG. 10A is a schematic diagram illustrating a configuration of an imaging unit in the second embodiment of the present invention.

Next, a configuration of the imaging unit 2 will be described. FIGS. 10A and 10B are schematic diagrams illustrating configurations of the imaging unit 2 in this embodiment. FIG. 10A is a front view of a first substrate 21 constituting the imaging unit 2. FIG. 10B is a front view of a second substrate 22 constituting the imaging unit 2. portions formed on the first substrate 21 and the second substrate 22 are substantially the same as those of the first embodiment. This embodiment is different from the first embodiment in that the light shielding portion 901 is formed in the second unit pixel region 222-2 as illustrated in FIG. 10B.

Next, a sequence in which an imaging signal is read from an analog memory 510 provided in the second substrate 22 will be described. FIG. 11 is a schematic diagram illustrating the sequence in which the imaging signal is read from the analog memory 510. First, a first scanning circuit 223 reads the imaging signal from the analog memory 510 arranged in the second unit pixel region 222-1 in which the AF photoelectric conversion element 701 is arranged ((1) to (4)). Subsequently, the first scanning circuit 223 reads the imaging signal from the analog memory 510 arranged in the second unit pixel region 222-2 in which no AF photoelectric conversion element 701 is arranged ((5) to (9)). Thereby, it is possible to read the imaging signal first from the analog memory 510 arranged in the second unit pixel region 222-1 in which no light is shielded.

In this embodiment, a method of simultaneously exposing all imaging photoelectric conversion elements 501 is used. The first scanning circuit 223 sequentially reads imaging signals from analog memories 510 after transferring the imaging signals collectively to the analog memories 510 after the end of exposure. For example, when the imaging unit 2 is not shielded from light by a light shielding means such as a mechanical shutter, the AF photoelectric conversion element 701 is constantly exposed while the imaging signal is read from the analog memory 510. Thus, when high luminance light is radiated to the imaging unit 2, charges accumulated in the AF photoelectric conversion element 701 are in a saturation state. In addition, when the saturation state has been reached, the charges are leaked charges overflowing from the AF photoelectric conversion element 701 and are likely to be applied as noise to the imaging signal held by the analog memory 510. In addition, the analog memory 510 is directly exposed to light and charges are generated. The generated charges are likely to be applied as noise to the held imaging signal.

However, in this embodiment, it is possible to suppress the above-described noise because the imaging signal is read first from the analog memory 510 arranged in the second unit pixel region 222-1 in which the AF photoelectric conversion element 701 is arranged.

In the above-described example, one second unit pixel region 222-1 and two second unit pixel regions 222-2 vertically aligned and arranged are designated as one set of unit pixel regions. However, the present invention is not limited thereto, and an arbitrary number of second unit pixel regions 222-1 and 222-2 may be designated as one set of unit pixel regions. FIGS. 12A and 12B are schematic diagrams illustrating outlines of the first unit pixel region 212 and the second unit pixel regions 222-1 and 222-2 when one second unit pixel region 222-1 and three second unit pixel regions 222-2 are designated as one set of unit pixel regions in this embodiment.

FIG. 12A is a front view of the first unit pixel region 212. FIG. 12B is a front view of the second unit pixel regions 222-1 and 222-2. In the illustrated example, configurations of the first unit pixel region 212 and the second unit pixel region 222-1 are substantially the same as the configurations illustrated in FIGS. 10A and 10B. A configuration of the second unit pixel region 222-2 may be substantially the same as the configurations illustrated in FIGS. 10A and 10B, and may include only a connection portion 23 and an imaging pixel circuit wiring region 601. In the illustrated example, it is assumed that the set of the one second unit pixel region 222-1 and the three second unit pixel regions 222-2 adjacent vertically and horizontally is designated as one set of unit pixel regions. That is, one contrast signal is output by the second unit pixel regions 222-1 and 222-2 for two rows and two columns. As described above, a set of an arbitrary number of second unit pixel regions 222-1 and 222-2 may be designated as one set of unit pixel regions.

Third Embodiment

Next, the third embodiment will be described. A configuration of an imaging apparatus 100 in the third embodiment is substantially the same as the configuration of the imaging apparatus 100 in the first embodiment. This embodiment is different from the first embodiment in that an AF photoelectric conversion element 701 is provided only in a second unit pixel region 222 on which light of a longest wavelength is incident among second unit pixel regions 222.

Figure 13A:
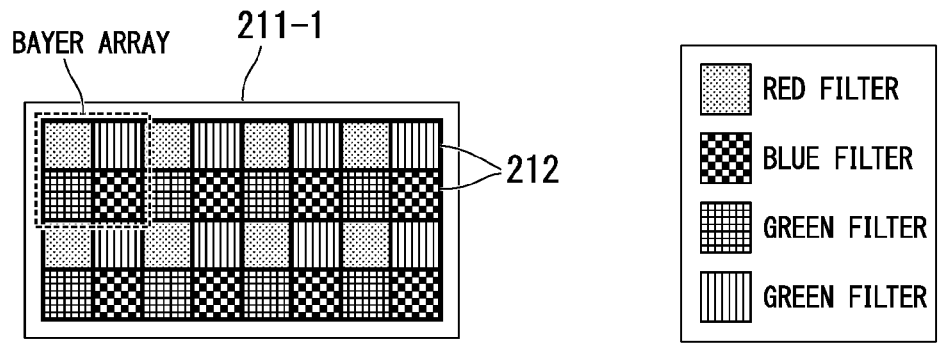
FIG. 13A is a schematic diagram illustrating an outline of a first pixel region and a second pixel region in a third embodiment of the present invention.
Figure 13B:
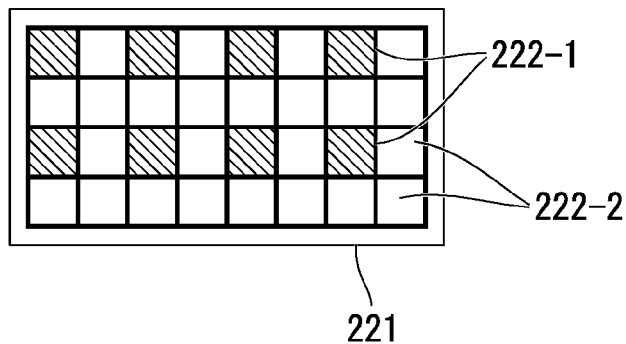
FIG. 13B is a schematic diagram illustrating an outline of the first pixel region and the second pixel region in the third embodiment of the present invention.
Figure 14:
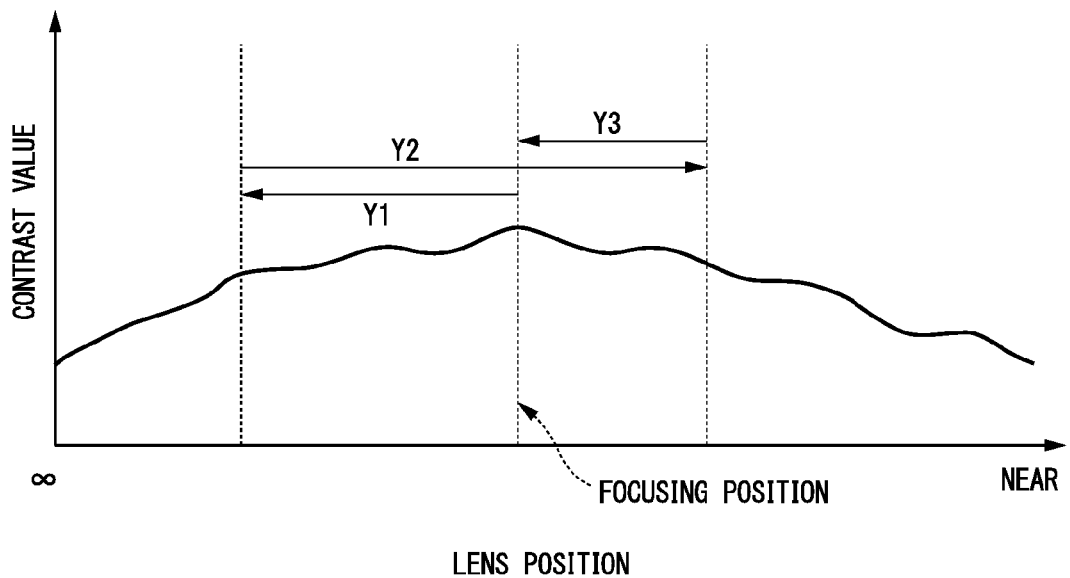
FIG. 14 is a graph illustrating a relationship between a position of a lens and a contrast value known in the related art.
Figure 15A:
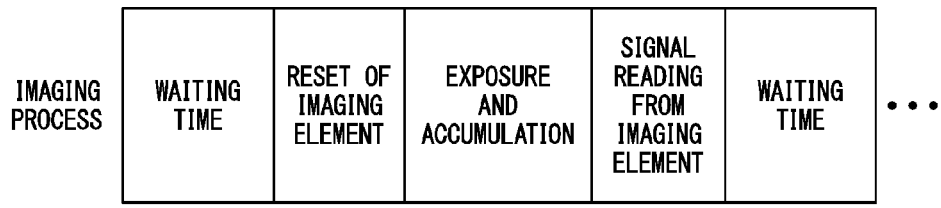
FIG. 15A is a timing chart illustrating processing timings of an imaging process and an AF process known in the related art.
Figure 15B:
FIG. 15B is a timing chart illustrating processing timings of the imaging process and the AF process known in the related art.
Figure 16:
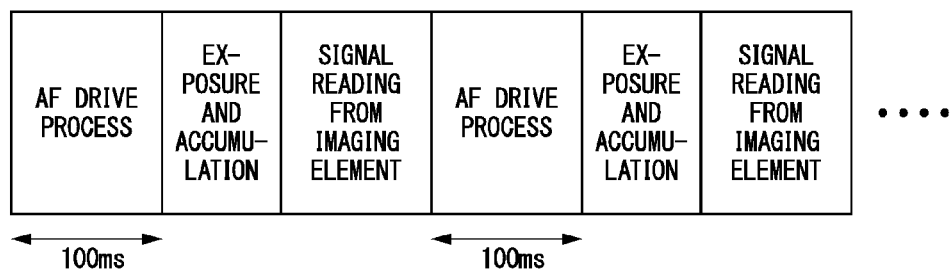
FIG. 16 is a timing chart illustrating processing timings when an imaging apparatus known in the related art captures an image.
Figure 17:
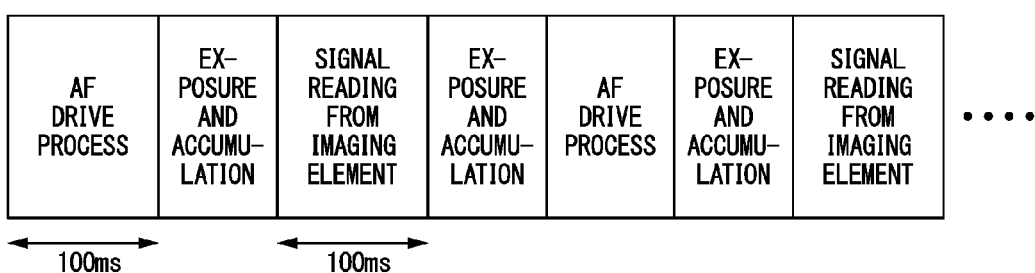
FIG. 17 is a timing chart illustrating processing timings when the imaging apparatus known in the related art performs an AF process only once immediately before continuous shooting is started.

Next, details of a first pixel region 211 and a second pixel region 221 will be described. FIGS. 13A and 13B are schematic diagrams illustrating outlines of the first pixel region 211 and the second pixel region 221 in this embodiment. FIG. 13A is a front view of the first pixel region 211. FIG. 13B is a front view of the second pixel region 221. In the illustrated example, color filters are formed in the first unit pixel regions 212 included in the first pixel region 211. An array of the color filters formed in the first unit pixel regions 212 is a Bayer array. Specifically, four unit pixel regions 212 adjacent vertically and horizontally are designated as one set of unit pixel regions. In addition, one set of unit pixel regions includes one first unit pixel region 212 in which a color filter configured to transmit light of a red wavelength band is formed, one first unit pixel region 212 in which a color filter configured to transmit light of a blue wavelength band is formed, and two first unit pixel regions 212 in which a color filter configured to transmit light of a green wavelength band are formed.

In addition, light of the longest wavelength is red light among red light, blue light and green light. Accordingly, the AF photoelectric conversion element 701 is provided in only the second unit pixel region 222-1 corresponding to the first unit pixel region 212 in which the color filter configured to transmit the light of the red wavelength band is formed among the second unit pixel regions 222 included in the second pixel region 221. No AF photoelectric conversion element 701 is provided in the other second unit pixel regions 222-2. Configurations of the second unit pixel regions 222-1 and 222-2 are substantially the same as those of the second embodiment. In addition, the operation of each portions is substantially the same as in the first and second embodiments.

Normally, the color filters configured to transmit light of red, blue, and green wavelength bands so as to separate light are aligned in a Bayer array in the imaging photoelectric conversion element 501. Thereby, only light of a specific wavelength band is transmitted and the transmitted light is converted by the imaging photoelectric conversion element 501 into electric charges. In addition, because absorption characteristics within the first substrate 21 differ according to a wavelength, and light of a short wavelength side such as blue light is absorbed in a shallow portion of the first substrate 21, the light is likely not to reach the AF photoelectric conversion element 701 arranged on the second substrate 22. Thus, in order to obtain a contrast signal with a higher precision, light of a long wavelength side capable of easily reaching the second substrate 22 is advantageous.

Thus, in this embodiment, the AF photoelectric conversion element 701 is arranged only in the second unit pixel region 222 corresponding to the first unit pixel region 212 in which the color filter configured to transmit light of a longest wavelength is formed. Thereby, it is possible to perform an AF process with a higher precision.

Although the first to third embodiments of the present invention have been described above in detail with reference to the drawings, specific configurations are not limited thereto and designs and the like can also be made without departing from the scope of the present invention. For example, although two substrates are connected by the connection portion 23 in the imaging unit 2 in the above-described embodiment, the present invention is not limited thereto, and three or more substrates may be connected by the connection portion 23. Although the preferred embodiments of the present invention have been described above with reference to the drawings, the present invention is not limited thereto, and addition, omission, replacement, and other changes of configurations can also be made without departing from the scope of the present invention. The present invention is not limited by the above description, and is limited only by the scope of the appended claims.

What is claimed is:

1. A solid-state imaging element comprising:
   a first substrate formed on a first semiconductor wafer, the first substrate including a plurality of first unit pixel regions arranged in a two-dimensional shape;
   a second substrate formed on a second semiconductor wafer, the second substrate including a plurality of second unit pixel regions arranged in a two-dimensional shape; and
   a plurality of connection portions, each of the plurality of connection portions arranged between corresponding one of the plurality of first unit pixel regions and corresponding one of the plurality of second unit pixel regions,
   wherein each of the plurality of first unit pixel regions including:
      at least one of a first photoelectric conversion element transmitting incident light; and
      a first part of a first readout circuit, the first readout circuit generating and transmitting first signal, using an output of the first photoelectric conversion element,
   wherein each of the plurality of second unit pixel regions including:
      at least one of a second photoelectric conversion element receiving the transmitted light; and
      a second readout circuit generating and transmitting second signal, using an output of the second photoelectric conversion element,
   wherein the first signal is an imaging signal,
   wherein the second signal is a signal to be used in imaging preparation,
   wherein the first part of the first readout circuit is arranged in the first substrate, and a second part of the first readout circuit is arranged in the second substrate,
   wherein the second readout circuit is arranged in the second substrate,
   wherein each of the plurality of connection portion electrically connects the first part of the first readout circuit and the second part of the first readout circuit,
   wherein the first part includes at least one of a first transistor electrically connected between the first photoelectric conversion element and the second part, and wherein the second part includes at least one of a second transistor electrically connected between the first part and a vertical signal line.

2. The solid-state imaging element according to claim 1, wherein the second part of the first readout circuit including a memory is configured to hold the imaging signals generated by the first photoelectric conversion elements.

3. The solid-state imaging element according to claim 2, comprising:
- a first scanning circuit configured to drive the first photoelectric conversion elements so as to collectively transfer the generated imaging signals to the memories and read the imaging signals from the memories in order from the memory arranged in a position near the second photoelectric conversion elements to the memory arranged in a position away from the second photoelectric conversion elements; and
- a second scanning circuit configured to read the signals to be used in the imaging preparation by driving the second photoelectric conversion elements in a read period in which the first scanning circuit reads the imaging signals.

4. The solid-state imaging element according to claim 1, further comprising:
- a first scanning circuit configured to drive the first photoelectric conversion elements; and
- a second scanning circuit configured to drive the second photoelectric conversion elements.

5. The solid-state imaging element according to claim 4, wherein the second scanning circuit reads the signals to be used in the imaging preparation by driving the second photoelectric conversion elements in a read period in which the first scanning circuit sequentially reads the imaging signals for every row in which the first photoelectric conversion elements are arranged by driving the first photoelectric conversion elements.

6. The solid-state imaging element according to claim 1, 
- wherein the first photoelectric conversion element includes a color filter, and
- wherein the second photoelectric conversion element is arranged in at least a partial region of a region corresponding to a region in which the first photoelectric conversion element having the color filter configured to transmit light of a longest wavelength among the first photoelectric conversion elements is arranged.

7. A solid-state imaging apparatus comprising:
the solid-state imaging element of claim 1,
wherein the signals to be used in the imaging preparation are used in an auto focus process.

8. A solid-state imaging apparatus comprising:
the solid-state imaging element of claim 1,
wherein the signals to be used in the imaging preparation are used in an auto exposure process.

9. A solid-state imaging apparatus using the solid-state imaging element of claim 1 in an imaging unit.

* * * * *